United States Patent
Hill

(10) Patent No.: US 7,218,095 B2
(45) Date of Patent: May 15, 2007

(54) METHOD AND APPARATUS FOR ELECTROMAGNETIC INTERFERENCE SHIELDING IN AN AUTOMATED TEST SYSTEM

(75) Inventor: Gregory S. Hill, Santa Rosa, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 56 days.

(21) Appl. No.: 10/903,132

(22) Filed: Jul. 30, 2004

(65) Prior Publication Data

US 2006/0022664 A1  Feb. 2, 2006

(51) Int. Cl.
*G01R 31/02* (2006.01)
*H05K 9/00* (2006.01)

(52) U.S. Cl. .................. 324/158.1; 174/385

(58) Field of Classification Search ............ None
See application file for complete search history.

(56) References Cited

U.S. PATENT DOCUMENTS

| | | | |
|---|---|---|---|
| 4,433,886 A | * 2/1984 | Cassarly et al. | 439/65 |
| 4,616,178 A | * 10/1986 | Thornton et al. | 324/754 |
| 4,731,577 A | 3/1988 | Logan | |
| 4,825,155 A | 4/1989 | Takamine | |
| 4,866,374 A | * 9/1989 | Cedrone | 324/537 |
| 4,875,006 A | * 10/1989 | Henley et al. | 324/97 |
| 5,457,398 A | * 10/1995 | Schwindt et al. | 324/754 |
| 2003/0111261 A1 | 6/2003 | Tan et al. | |

* cited by examiner

*Primary Examiner*—Ernest Karlsen

(57) ABSTRACT

An electronic test system load board electromagnetic shield is presented. The load board electromagnetic shield may have a DUT docking plate having a periphery rim on a first side with an aperture extending through the docking plate that has a waveguide chimney through which a DUT may be inserted into a socket or contactor on the load board.

4 Claims, 6 Drawing Sheets

METHOD AND APPARATUS FOR ELECTROMAGNETIC INTERFERENCE SHIELDING IN AN AUTOMATED TEST SYSTEM

BACKGROUND

In electronics testing systems, such as an integrated circuit (IC) or a system on a chip (SOC) test system, the electronic circuit testers typically test the performance of an IC, SOC or similar device. An electronic circuit tester may be used to test finished packaged devices or integrated circuits at various stages of the manufacture of the device or integrated circuit, from the initial wafer processing stage to the final packaging stage. A conventional tester typically includes a test head and electronic test and measurement instruments. The electronic test and measurements instruments, may be contained within the test head or in equipment racks that are electrically connected to the test head. The test head typically interfaces with a device or an integrated circuit through a printed circuit board known as a load board. In these test systems, the load board is used to provide an electrical and mechanical interface between the tester and the device-under-test (DUT). The load board extends measurement electronics of the automated test system to the pins or pads of the DUT. A custom load board is usually required for each unique DUT or family of DUTs.

Since the electronic circuit tester can be employed to test both packaged devices and integrated circuits in many forms, the test head is usually mounted by pivotal connections to a dolly or to the instrument rack. The pivotal connections enable the test head to be positioned in many positions including an approximately upward facing horizontal position so that the appropriate load board can be mounted on the test head of the electronic circuit tester by an operator. The test head can also be pivoted to any of many angular positions, such as to a substantially vertical position so that the load board can interface with an automated material handler, for example, to test packaged devices or integrated circuits. The automated material handler feeds each packaged device or integrated circuit to be tested (either or both of which hereafter referred to as a device or a DUT) to the electronic circuit tester.

A conventional tester 10, is shown in FIG. 1. Tester 10 comprises a test head 12 electrically connected by cables routed through a conduit 14 to rack(s) 16 of electronic test and measurement instruments, such as AC and DC signal generators for applying electrical signals to a device or integrated circuit interfaced to the test head 12, and signal analyzers, for example, a network analyzer, spectrum analyzer, oscilloscope, or other waveform digitizing or signal processing equipment, for measuring the response(s) to applied signals. Test head 12 may include circuitry that performs distribution of electrical signals, signal separation, frequency translation, amplification, attenuation, switching, or other conditioning or modification of electrical signals prior to being routed to the rack 16 or to a device or integrated circuit being tested.

Test head 12 interfaces to a device or integrated circuit through a load board 18 and a fixture board 20 mounted to the test head 12. Alternatively, prior to installation of fixture board 20, a calibration board (not shown), having a configuration similar to the fixture board may be connected to the test head 12 for calibrating the test head 12. The configuration of the load board 18 depends on the type or family of device or integrated circuit being tested, such as an analog or digital electronic circuit, while the configuration of the fixture board 20 is generally specific to the family or particular device or integrated circuit under test (DUT).

Fixture board 20 interfaces to a device-under-test (DUT) board 22 that may comprise inductors, capacitors, and other electronic components or circuit mounted to or fabricated on the DUT board for decoupling, filtering attenuating or otherwise modifying electrical signals transmitted to or received from a device or integrated circuit under test. Finally, the DUT board 22 is connected to a socket 24 for effecting electrical connection(s) between tester 10 and the actual electronic circuit or device-under-test (DUT), such as a packaged device or integrated circuit 26. Alternatively, socket 24 may be mounted directly to the load board 18.

Test head 12 is mounted to a dolly 28. Test head 12 may be mounted by pivotal connections 30 to dolly 28. Pivotal connections 30 enable test head 12 to be positioned in an approximately upward facing horizontal position so that the appropriate load board 18 and calibration or fixture board 20 and DUT board 22 with socket 24 can be mounted to test head 12 of tester 10 by an operator. Test head 12 may be pivoted to any angular position so that socket 24 may interface with an automated material handler 32, for example, which rapidly feeds each DUT 26 to the tester 10 to be tested.

Alternatively, a wafer probe (not shown) may be substituted for the socket 24 mounted to the DUT board 22. Pivotal connections 30 enable test head 12 to be pivoted to an inverted position to test devices or integrated circuits on a wafer (not shown) at a wafer probing stations (not shown).

In order to interface socket 24 to the automated material handler 32, or a wafer probe (not shown) at a wafer probing station (not shown), a frame 34 is mounted to test head 12. A handler mounting plate 36 that mates with frame 34 is mounted to the automated material handler 32 or wafer probing station (not shown) to align test head 12 with the handler or station so that packaged devices or integrated circuits or devices or integrated circuits on wafer can be tested.

Unlike most of the printed circuit boards and electronics in a test system 10, the load board 18 is not enclosed within a chassis, which means that load boards 18 are susceptible to electromagnetic interference (EMI) that would normally be attenuated by a chassis. It is not uncommon to find very high levels of EMI on test floors at IC test companies from area cellular telephone relay and broadcast towers or other local industrial activity. One potential method of EMI shielding is to build a screen room around the tester. However, as testers are very large, this is an expensive solution, inconvenient, wastes production or test floor space and reduces the flexibility of production or tester floor space.

SUMMARY

A novel method and apparatus for providing electromagnetic interference shielding integral with a load board and handler of an automated integrated circuit tester is presented. In particular, a DUT docking plate forms a top electromagnetic interference shield and wave-guide with a load board in an automated integrated circuit tester.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

There are typically three major systems involved in many electronic test systems for integrated circuit (IC), system on a chip (SOC) or similar electronic devices. These include the tester that contains the measurement electronics; the load board that is the interface between the device under test (DUT) and the tester; and the handler that may automatically insert the DUT and control the temperature of the DUT during test. Such systems may include automated test systems or equipment that may thereby include automated testers or handlers and the like. Herein disclosed is an apparatus and method including an electromagnetic interference (EMI) shielding of a load board that provides shielding, while simultaneously providing an aperture to accommodate a DUT being inserted into a socket on the load board by a handler.

Figure 1:
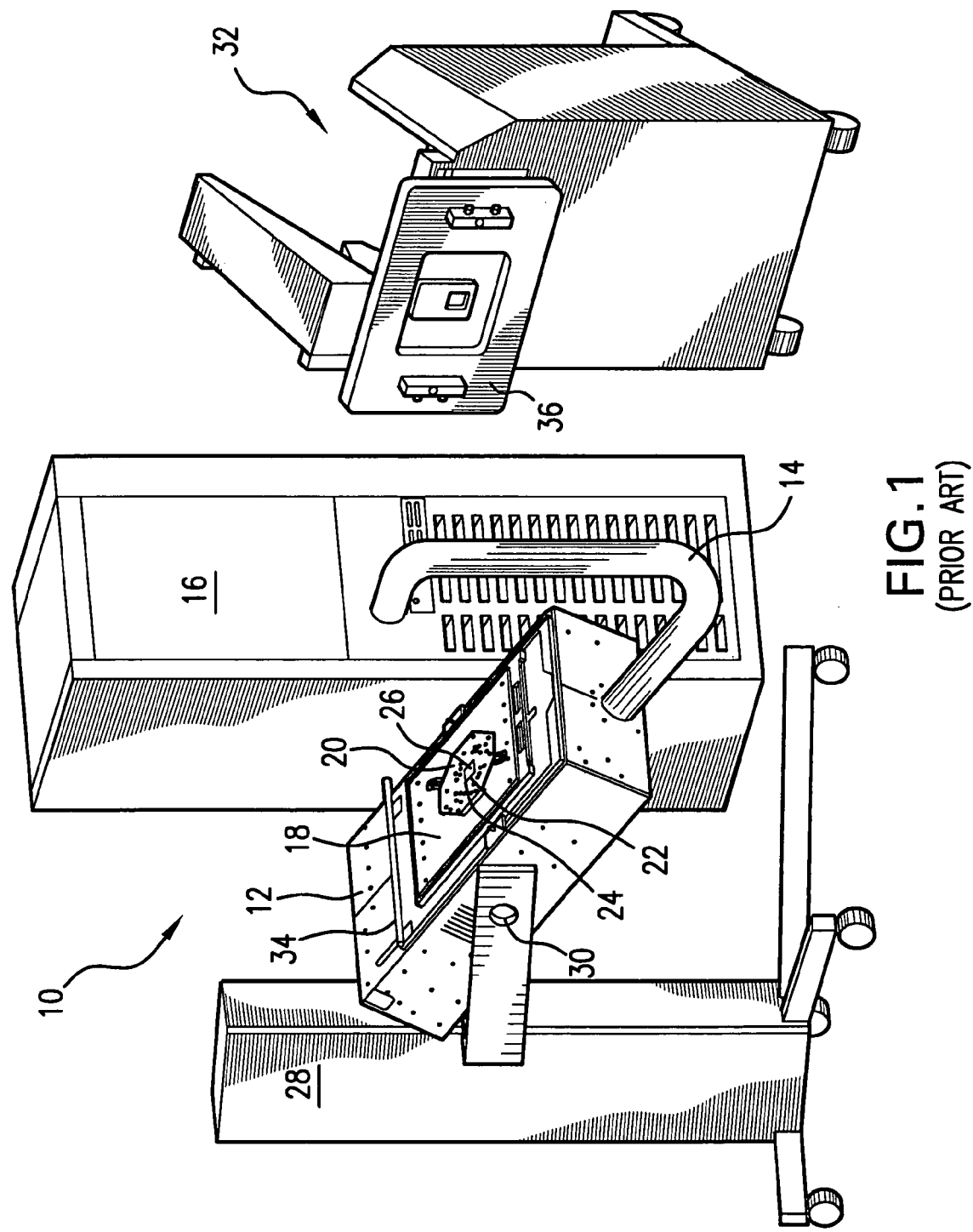
FIG. 1 illustrates an isometric view of a conventional electronic circuit tester.
Figure 2:
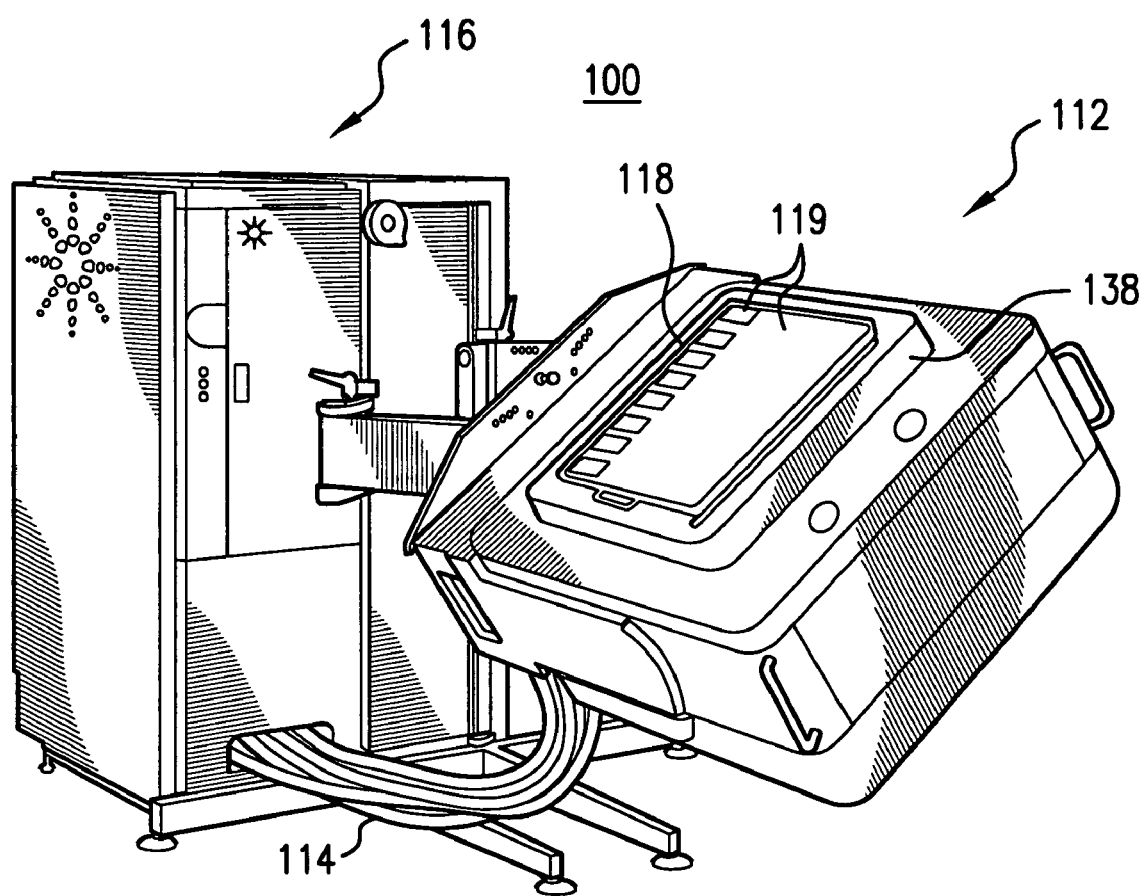
FIG. 2 illustrates an isometric view of an electronic circuit tester in accordance with an embodiment of the invention is incorporated.

Some of the major component portions of an electronics test system 100 are shown in FIG. 2. A printed circuit board, known as a load board 118 is shown mounted on the test head 112 of tester 100. Test head 112 may be articulated so that it may be docked to a handler (see FIG. 1), which may be used to automatically insert a DUT into a contactor or socket on a load board 118. A custom load board 118 is usually required for each unique DUT or family of DUTs. The load board 118 is responsible for extending the automated test system measurement electronics between the test head 112 and the pins or I/O of the DUT. The load board 118 interfaces with the test head 112 via pin electronic interface 138 on the test head 112. Pin electronic interface 138 supports pin electronics that mechanically and electrically interface between the test head 112 and load board 118.

A support rack 116 of the tester 100 contains electronic test and measurement instruments, which may be connected to the test head 112 via cables 114. An exemplar automated test system as the one shown in FIG. 1 is a system-on-a-chip (SOC) test system, such as the Agilent 93000 test system available from Agilent Technologies, Inc., Palo Alto, Calif., USA.

Figure 3:
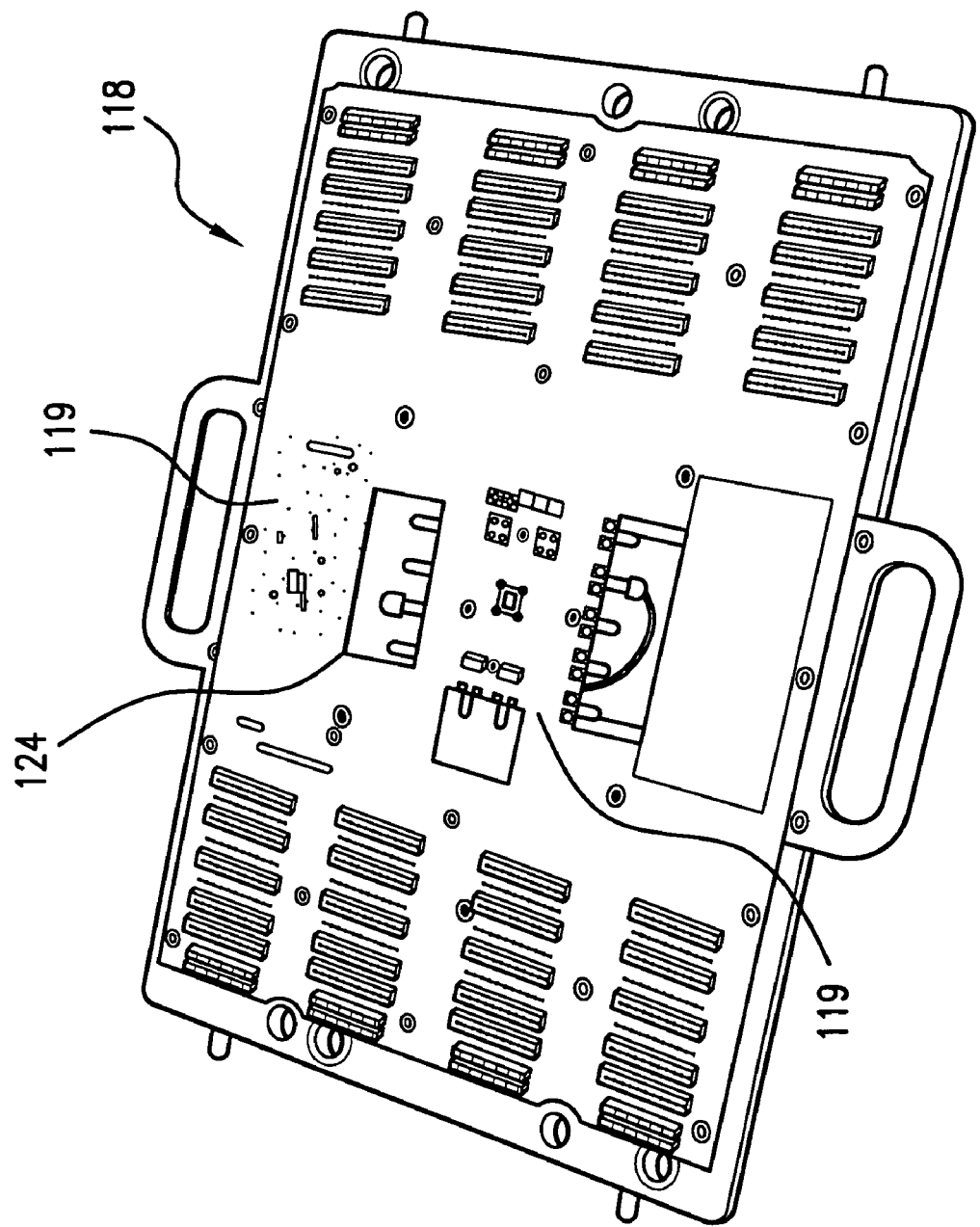
FIG. 3 illustrates a top perspective view of a load board in accordance with an embodiment of the invention.

Load board 118 is shown in greater detail and separate from the test head 112 in FIG. 3. Load board 118 may contain many components on the topside, in addition to a contactor or socket that a DUT is inserted into for test. Each type of DUT or family of DUTs usually requires a custom load board 118. The design and performance of a load board 118 may be a limiting factor in overall test performance. Load boards vary in their complexity; they may have a single contactor or socket 124 (hereafter referred to as socket), or they may have many sockets. As shown in FIG. 3, load boards 118 may have many electrical components 119 associated with or incorporated thereon, such as bias and impedance matching circuitry. Often this circuitry is on the topside of the load board 118, as placing the electronics or circuitry on the backside may introduce undesirable parasitic inductance. The bottom side of the load board 118 connects to and interfaces with the test head 112. The topside of the load board 118, as shown in FIG. 3, connects to the handler (32 in FIG. 1).

The load board 118 may fulfill multiple roles and objectives in the test system. For example, the load board 118 may extend the test head measurement resources to the DUT; provide power to the DUT; connect various grounds used by the test head measurement resources to minimize noise; reproduces the test circuit; provide a mechanical interface for automatic DUT insertion into socket 124; and provide a mechanical interface to support temperature testing of the DUT.

Figure 4:
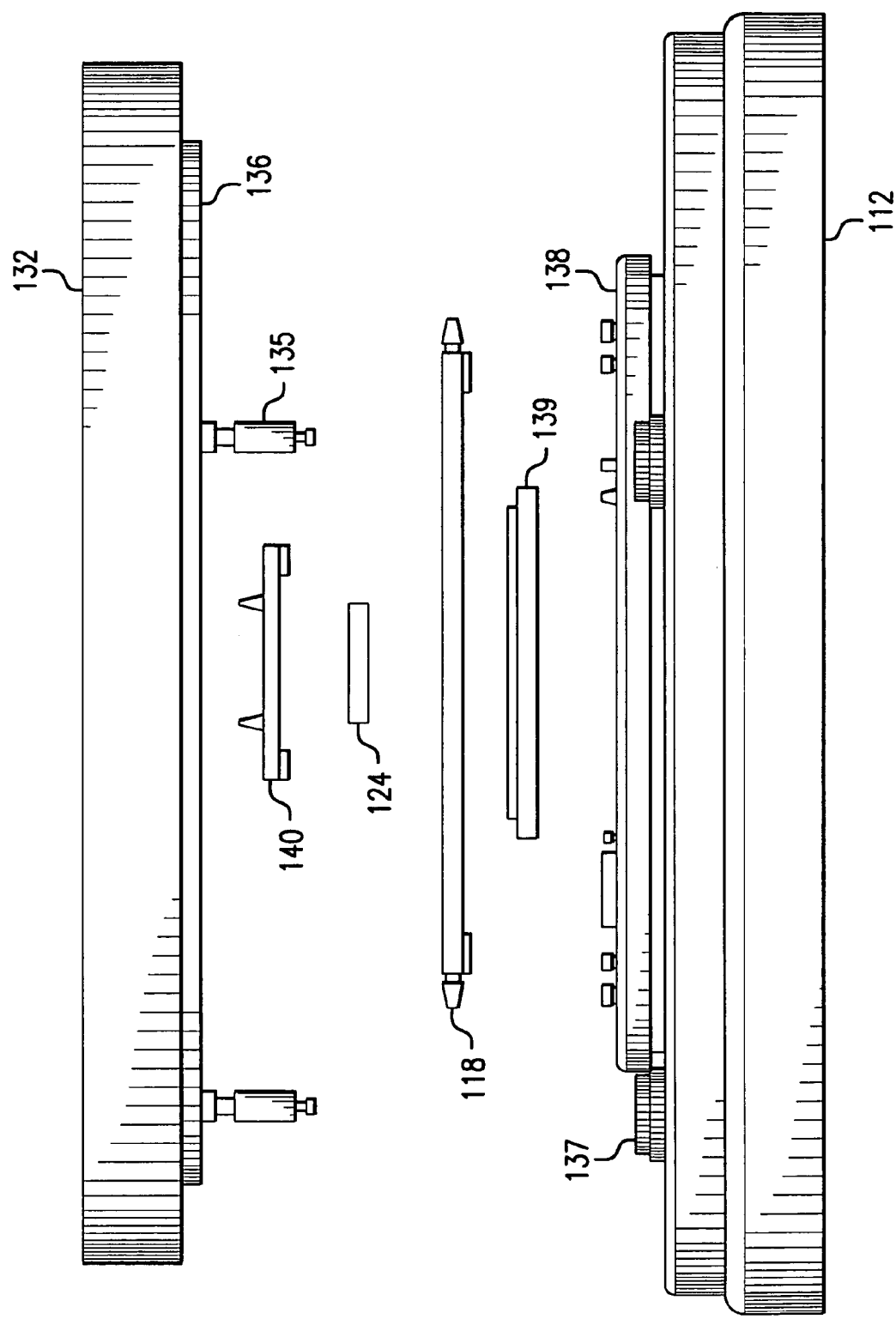
FIG. 4 illustrates an exploded side view of a handler being connected to a test head in accordance with an embodiment of the invention.

FIG. 4 illustrates some hardware elements, which may be used to connect the test head 112 to the handler 132. In the center of FIG. 4, load board 118 is shown. The load board 118 is mounted to a pin electronic interface 138 that mechanically supports the load board 118 and supports the pin electronics that interface between the load board 118 and the test head 112. A stiffener inlay 139 may be inserted between the load board 118 and the pin electronic interface 138. Stiffener inlay 139 may be used to provide increased rigidity to the load board 118 to support the force applied by the handler 132 and prevent warping or cracking of the load board 118. Stiffener inlay 139 may be an aluminum web or other known stiffening material.

A contactor or socket 124 is mounted to the top surface of the load board 118. The contactor 124 is usually a durable socket, capable of thousands of DUT insertions by the handler. The amount of time required to move the DUT from the handler 132, insert it into the socket 124, remove it from the socket, 124, and place it back into the handler tray (not shown) is called the index time, which is a critical parameter that directly affects the speed, throughput and cost of test. There is also shown a DUT docking plate 140 (also referred to as a seal adapter), which is the part of the handler 132 that makes direct contact with the top surface of the load board 118. The DUT docking plate 140 is mounted to the handler docking plate (see 36 in FIG. 1), which is responsible for docking the handler 132 to the load board 118 and the test head 112.

Figure 5:
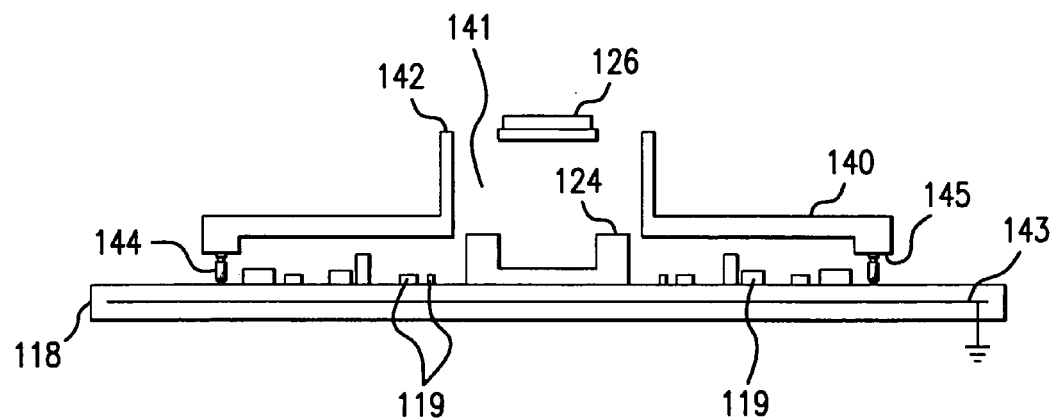
FIG. 5 illustrates a side view of a load board assembly in accordance with an embodiment of the invention.
Figure 6:
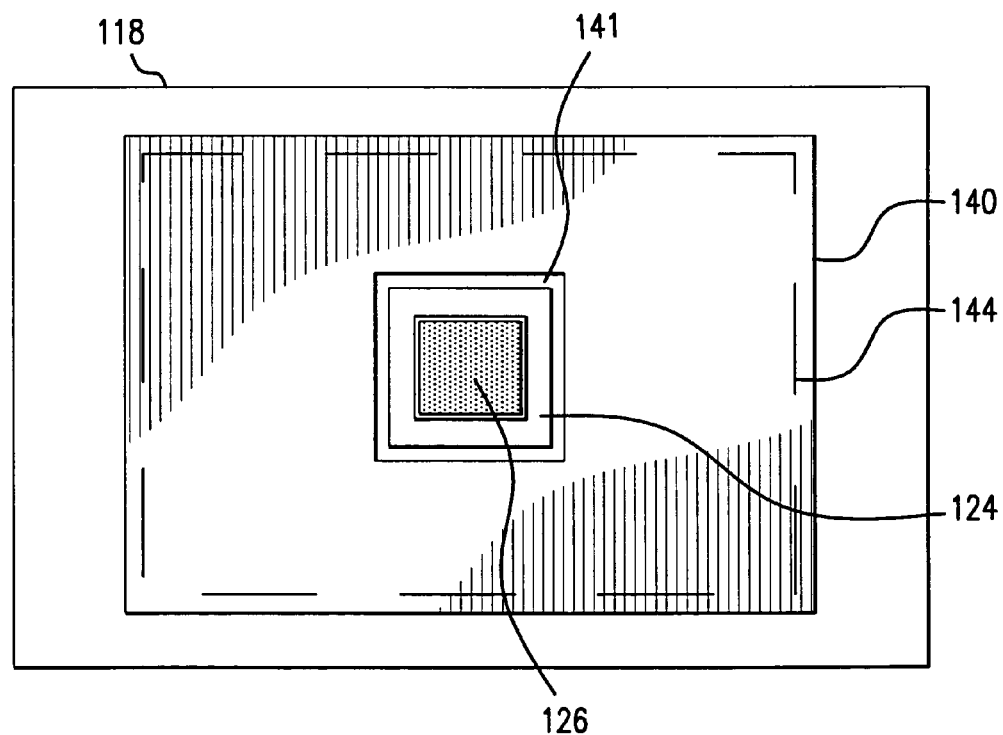
FIG. 6 illustrates a top view of a load board assembly in accordance with an embodiment of the invention.

FIGS. 5 and 6 illustrate how the DUT docking plate 140 act as a top plate of an EMI shield for the socket 124, the DUT 126 and load board circuitry 119. A below-cutoff waveguide chimney 142 extends from aperture 141 of the DUT docking plate 140 through which the DUT is inserted by the handler into the socket 124 on the load board 118. In practice, the load board 118 contains one or more ground planes 143 that are connected to ground. The ground plane(s) 143 of the load board 118 are connected to the docking plate using gold-plated beryllium-copper spring fingers 144, or other known conductive attachment means. The spring fingers 144 may be attached to the load board 118 so that the docking plate 140 can be easily removed when the handler 132 is undocked from the load board 118 and test head 112. The docking plate surface 145 that makes contact with the spring fingers 144 may be a rim 145. Rim 145 may be gold-plated to prevent the formation of resistive oxides that may reduce the effectiveness of the EMI shield over time.

The waveguide chimney 142 may provide further attenuation of radiating interference signals from external sources. Wave-guide chimney attenuates the affects of any EMI on the DUT or circuitry on the load board. The aperture dimensions 141 and chimney height may be selected to provide adequate attenuation of interfering signals, while accommodating the dimensions of the DUT 126 being inserted into the socket 124 and not significantly increasing the index time of the handler 132. The EMI shielding DUT docking plate 140 may be made of steel or any known conductive material.

Figure 7:
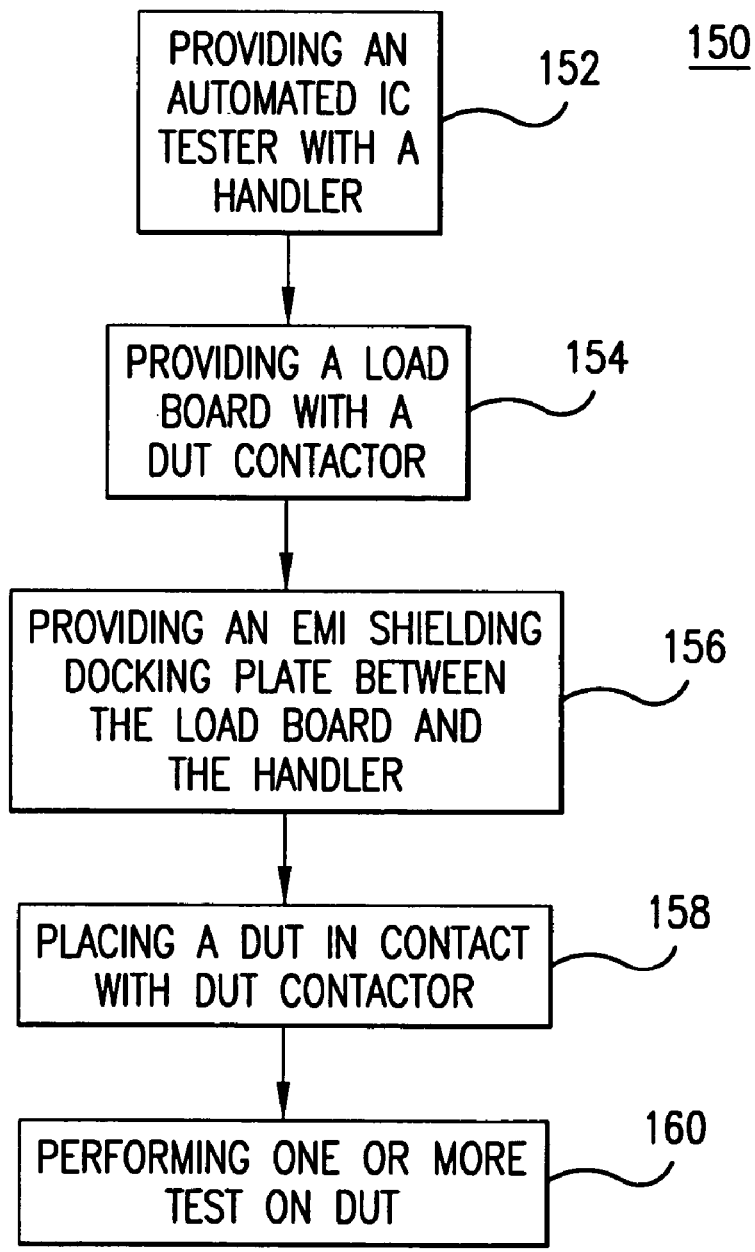
FIG. 7 illustrates a flow chart for a method of testing a DUT in accordance with an embodiment of the invention.

FIG. 7 shows a flow chart 150 for a method of testing according to an embodiment of the invention whereby an electronics test system including a tester with a test head and a handler is provided 152 and a load board with a DUT socket is provided 154. An EMI shielding DUT docking plate is disposed between the load board and handler 156. A DUT is inserted into the socket by the handler 158. And the tester performs test(s) on the DUT 160.

It will be appreciated by those skilled in the art that the present invention provides shielding to the DUT 126, the contactor/socket 124 and the circuitry on the load board 118 while utilizing existing system elements and without adding separation between the load board 118 and the docking plate or handler that the addition of a separate EMI shield would create; without significantly increasing the length of the path the DUT must travel between the handler 132 and the socket 124; without significantly increasing the test time and associated cost of test; without significantly impacting test floor usage; without significantly adding to the complexity of the test system or the load board.

Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims.

What is claimed is:

1. An electronics test system load board EMI shielding apparatus comprising:
   a load board with a ground plane;
   a contactor attached to the load board;
   a conductive plate having a periphery conductive rim on a first side and at least one aperture extending through the plate, wherein the rim is conductively attached to the ground plane of the load board; and
   a device handler adapted to insert an electronic device to be tested into the contactor attached to the load board through the aperture in the conductive plate.

2. The load board EMI shielding apparatus according to claim 1, further comprising conductive spring fingers connected to a ground plane on a load board, such that the periphery conductive rim of the conductive plate attaches to the conductive spring fingers to create an EMI shield.

3. The load board EMI shielding apparatus according to claim 1, further comprising a conductive waveguide chimney on a second side of the conductive plate extending around and upward from the aperture.

4. An EMI shield with a wave guide aperture in an electronic test system comprising:
   a load board with a ground plane;
   a contactor attached to the load board;
   a conductive plate having a conductive rim on a first surface around a periphery of the conductive plate and an aperture in the conductive plate with a waveguide chimney extending from a second surface of the conductive plate and surrounding the aperture, wherein the rim is attached to the ground plane of the load board to accommodate inserting electronic devices to be tested into the contactor attached to the load board through the aperture in the conductive plate.

* * * * *